United States Patent [19]

Harringer et al.

[11] Patent Number: 4,461,073
[45] Date of Patent: Jul. 24, 1984

[54] DEVICE FOR INSERTING AND EXTRACTING CIRCUIT MODULES WITH DUAL-IN-LINE LEADS

[75] Inventors: Robert V. Harringer, Joliet; Frank J. Nadherny, Downers Grove; Robert O. Rada, Brookfield, all of Ill.

[73] Assignee: AT&T Technologies, Inc., New York, N.Y.

[21] Appl. No.: 437,056

[22] Filed: Oct. 27, 1982

[51] Int. Cl.³ .................... H05K 13/04; H05K 3/30
[52] U.S. Cl. .................................... 29/741; 29/764
[58] Field of Search .......... 29/741, 764, 762, 837–839, 29/758, 739

[56] References Cited

U.S. PATENT DOCUMENTS

| | | | |
|---|---|---|---|
| 3,516,142 | 6/1970 | De Rose et al. | 29/764 X |
| 3,538,580 | 11/1970 | Bruner | 29/764 X |
| 3,797,092 | 3/1974 | Einarson | 29/764 X |
| 4,152,827 | 5/1979 | Walton | 29/764 |
| 4,392,301 | 7/1983 | Hannes et al. | 29/741 |

Primary Examiner—Carl E. Hall
Attorney, Agent, or Firm—K. R. Bergum

[57] ABSTRACT

A hand-operated device 10 is disclosed for inserting or extracting the dual-in-line leads (14) of a circuit module (12), particularly of the type having a relatively fragile circuit-supporting substrate (18), into or out of respective lead-engaging through-holes of a circuit board (17), or a board-mounted socket. The device (10) comprises a pair of mutually disposed, longitudinally extending, and spring-biased gripping jaws (21, 22), interconnected by a spaced pair of guide rods (26, 27). Each guide rod is fixedly secured at one end within a bore (24a or b) of one jaw-supported boss (24), with the other end being slidably received within an aligned bore (29a or b) of an other jaw-supported boss (29) so as to allow precisely controlled, relative linear displacement of the jaws. Two coil springs (33, 34), each mounted on a different one of the guide rods (26 or 27), and maintained in a compressive state between the inner faces of the jaw-supported bosses (24, 39), cooperate with a retractable, boss-mounted and keyway-guided cover plate (46) to control the maximum (and optionally minimum) spacing between the jaws (21, 22), as well as to effect the temporary releasable locking of the jaws after a circuit module has been gripped therebetween. Such releasable locking action is effected through the use of two specially configured cover plate keyways (48, 49) and three boss-secured key members (51, 53 and 54) selectively associated therewith. An adjustable stop member (66) supported by, and extending through, the sidewall of one jaw (21) is employed to limit the minimum spacing between the gripping jaws (21, 22) independently of said cover plate (46).

15 Claims, 5 Drawing Figures

FIG. 3
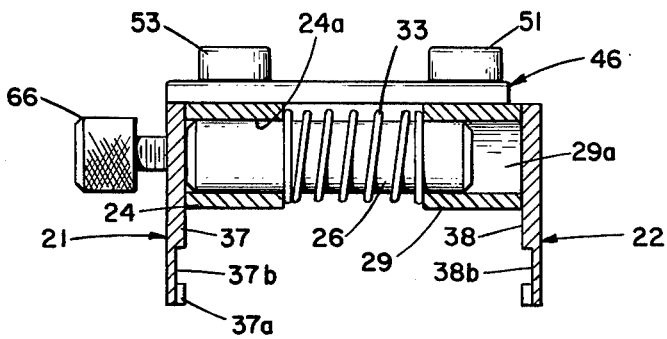
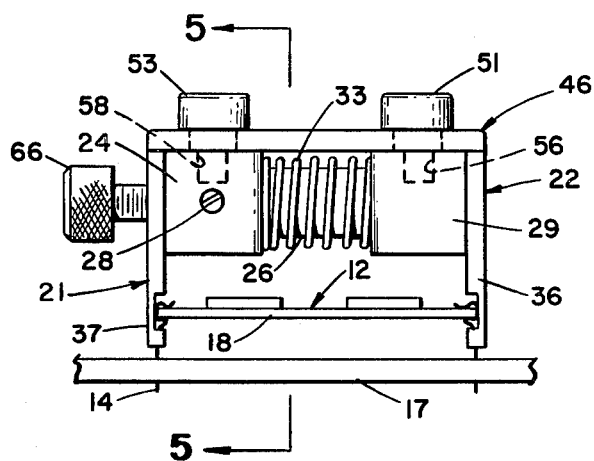
FIG. 4
FIG. 5
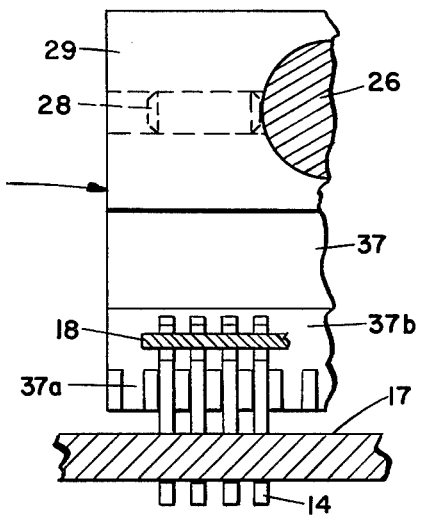

DEVICE FOR INSERTING AND EXTRACTING CIRCUIT MODULES WITH DUAL-IN-LINE LEADS

FIELD OF THE INVENTION

This invention relates to a device for handling circuit modules with multiple leads and, more particularly, to such a device of the type applicable for use in inserting the leads of such modules into or extracting them from aligned lead-engaging circuit board through-holes or board-mounted sockets.

BACKGROUND OF THE INVENTION

With the advent of complex, and often fragile, electronic circuit modules, typically having dual-in-line leads that extend downwardly from two mutually disposed sides thereof, a need has arisen for specially constructed tools or devices for inserting and extracting such modules from circuit boards or from sockets mounted thereon.

A particularly serious problem has arisen in this regard with respect to circuit modules of the so-called hybrid integrated circuit (HIC) type employing thin film circuitry fabricated on a relatively thin, fragile, circuit-supporting ceramic substrate. In one such circuit module, the ceramic substrate measure 1600 mils in width, 3600 mils in length and only 62 mils in thickness, with 36 ribbon-like leads extending downwardly from, and disposed along each of the two longest mutually disposed sides of, the substrate to form a dual-in-line configuration. The leads in the illustrative circuit module each have a width of 30 mils, a thickness of 15 mils, and a centerline-to-centerline spacing of 100 mils.

With the illustrative ceramic substrate and associated leads having such minute dimensions, it becomes readily apparent that considerable care is required in handling such circuit modules during their lead insertion into, or extraction out of, a common support member, such as a circuit board, or a board-mounted socket.

There have been a number of simplified hand-held tools and devices constructed heretofore for inserting and extracting multi-leaded circuit modules, including those of the dual-in-line package (DIP) type. One such tool of plier-like configuration is disclosed in N. S. Einerson U.S. Pat. No. 3,797,092, and is adapted to grasp and hold a DIP while the leads thereof are being inserted into or extracted from a supporting member. Such handle-operated devices tend to be somewhat cumbersome both to orient and to actuate, particularly when required to be positioned in a substantially vertically oriented position, during a DIP insertion or extraction operation. In addition, the pivotally actuated jaws of such a plier-like tool normally require appreciable circuit board space adjacent the gripped, or to be gripped, sides of a DIP as mounted on a circuit board. In many demanding electronic circuit and equipment applications, however, board space is often at a premium because of the need for high density circuitry. As a result, the spacings between multi-leaded circuit modules are often considerably less than that required to accommodate any type of pivotally actuated gripping jaws.

P. M. Bruner U.S. Pat. No. 3,538,580 discloses another type of hand-operated tool for inserting and/or extracting DIP-type components into or out of an associated header. The tool comprises a relatively rigid tubular-like frame which is dimensioned to closely fit about the body of a component. Thereafter, resilient working arms of the frame, formed with teeth, when manually biased inwardly, grip the component in the spaces defined between the leads thereof. The tool further includes a series of rigid fingers which engage the component leads at their point of entry into the body of the components so as to facilitate the insertion of the leads into a mating header. Such a tool, disadvantageously, is not adjustable so as to accommodate multi-leaded components or circuit modules, in general, having body portions of different widths, as well as lengths.

Moreover, neither of the above-mentioned types of hand-held insertion or extraction tools provides any means for temporarily releasably locking the jaws, or resilient arms thereof after a given multi-leaded component or circuit module has been reliably gripped therebetween. This would be very advantageous, for example, in facilitating the straightening of any bent circuit module leads either before their insertion into, or after their extraction from, lead engaging through-holes or receptacles of an associated support member.

There thus has been a definite need for a compact, easily manipulated and hand-operated device of simplified, reliable and inexpensive construction, and which is versatile with respect to accommodating multi-leaded circuit modules of varying types and sizes.

SUMMARY OF THE INVENTION

In accordance with the principles of the present invention, one preferred illustrative multi-leaded circuit module insertion and/or extraction device comprises a pair of mutually disposed, longitudinally extending and spring-biased gripping jaws. The jaws are interconnected by a spaced pair of guide rods, each of which is fixedly secured at one end within a bore of one jaw, with the other end being slidably received within an aligned bore of the other jaw so as to allow precisely controlled, relative linear displacement of the jaws.

The inner face of a lower portion of each jaw in the one preferred embodiment is formed with an array of vertically oriented lead-nesting grooves, and with a longitudinally oriented channel that communicates with the upper ends of the grooves. The channel is particularly adapted to nest a peripheral edge of a circuit module, when of the type having a relatively thin, and often fragile, circuit-supporting substrate, such as of ceramic material.

A pair of coil springs, each coaxially mounted on a different one of the guide rods, and maintained in a compressive state between the two jaws, cooperate with a retractable jaw-mounted and keyway-guided cover plate to control the maximum (and optionally minimum) spacing between the jaws, as well as to effect the temporary releasable locking of the jaws in a closed position after a circuit module has been gripped therebetween. As previously mentioned, this may often prove advantageous, for example, in allowing an operator to more freely use both hands (and fingers) to realign any misaligned leads of a circuit module before a lead insertion operation.

BRIEF DESCRIPTION OF THE DRAWINGS

FIG. 3 is a sectional end view of the device of FIG. 1, taken along the line 3—3 of FIG. 1, showing in greater detail the manner in which one of the spring-biased guide rods is mounted at opposite ends in the mutually disposed jaw-secured bosses of the device;

FIG. 4 is an end view of the device of FIG. 1, illustrating the jaws thereof in a closed position to grip opposite edges of a multi-leaded circuit module preparatory to effecting the extraction of the leads of the latter from the respectively associated lead-engaging through-holes of a circuit board, and FIG. 5 is an enlarged, sectional view of one gripping jaw, taken along the line 5—5 of FIG. 4, illustrating in greater detail the construction of the vertically disposed lead-engaging grooves and of the longitudinally disposed channel formed in the inner face of each jaw, the channel being adapted to nest a peripheral edge (or sidewall) of a circuit module.

DETAILED DESCRIPTION OF THE INVENTION

It should be appreciated that while the invention is described in detail herein primarily in regard to the insertion or extraction of a substrate-based, multi-leaded circuit module into or out of aligned circuit board through-holes, the preferred illustrative device embodiment for carrying out such operations is equally applicable for use with many other types of multi-leaded circuit assemblages. Accordingly, general reference to a "circuit module" herein is intended to embrace conventional dual-in-line packages (DIPs), flat packs, circuit packs, circuit cards or chip carriers, as well as otherwise broadly defined multi-leaded electronic components, devices, assemblies or packages.

Figure 1:
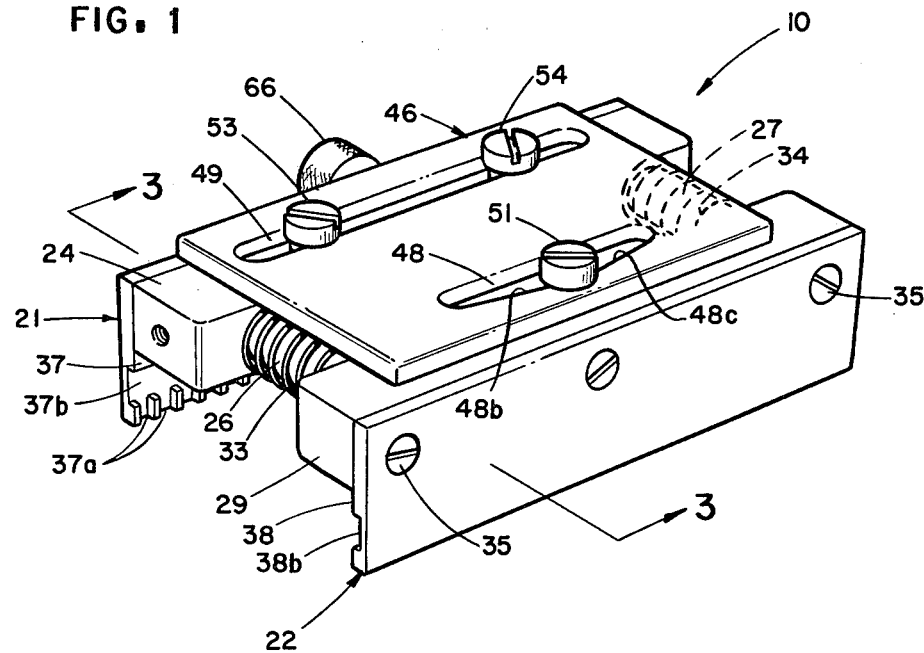
FIG. 1 is a perspective view of one preferred illustrative embodiment of a device for inserting or extracting the leads of multi-leaded circuit modules, particularly of the type having a relatively fragile circuit-supporting substrate and dual-in-line leads, into or out of respective circuit board receiving through-holes or board-mounted sockets, in accordance with the principles of the present invention.

With particular reference first to FIGS. 1 and 4, there is illustrated a device 10 which is primarily adapted for use in temporarily grasping opposite sides of a circuit module 12 and, thereafter, inserting or extracting the dual-in-line leads 14 thereof into or out of respective lead-receiving through-holes of a circuit board 17. It is understood, of course, that the general construction of the device 10 also makes it applicable for use in circuit module insertion or extraction operations wherein the leads engage board-mounted sockets.

As previously noted, one such circuit module with which the subject device 10 has proven to have particular advantageous utility is more specifically described as a thin film hybrid integrated circuit. One form of the latter utilizes a thin, and relatively fragile circuit-supporting ceramic substrate 18, illustrated in FIG. 4. With such a substrate, any non-uniformly distributed displacement forces imparted thereagainst can readily cause either the chipping or cracking thereof, often resulting in the total loss of such a circuit.

Figure 2:
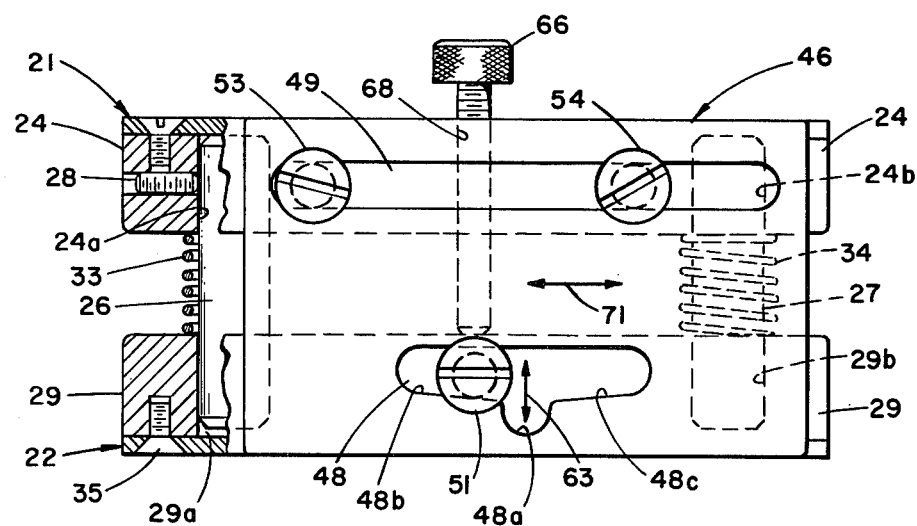
FIG. 2 is a plan view, partially in section, and with certain structural features shown in phantom, of the device of FIG. 1.

With specific reference now to the construction of the device 10 itself, as best seen in FIGS. 1-3 it comprises a pair of mutually disposed, longitudinally extending and spring-biased gripping jaws 21 and 22. The jaws are interconnected by a spaced pair of parallel extending guide rods 26 and 27, each of which is fixedly secured at one end to a common inwardly extending, jaw-secured boss 24 and, specifically, within a bore 24a or b thereof (best seen in FIGS. 2 and 3). Each guide rod is reliably secured within the associated bore 24a or b by any suitable means, such as by a threaded fastening member 28 depicted in FIGS. 2, 4 and 5.

The other end of each guide rod 26 or 27 is supported by a similar inwardly extending, jaw-secured boss 29 and, specifically, is slidably received within a slightly oversized bore 29a or b thereof. In order to attain more precise and low friction displacement of the guide rods 26, 27 within the last-mentioned bores of the boss 29, they could readily be suitably journaled therein in any well-known manner, if desired. This has not been found to be necessary however, even for the rather demanding application of primary concern described herein. In any event, as thus interconnected, manual displacement of the gripping jaws 21, 22 relative to each other is precisely controlled, and effected in only a desired linear direction.

The jaws 21, 22 are normally spring biased to an open position by means of two coil springs 33 and 34. These springs are respectively coaxially mounted on the guide rods 26 and 27, and maintained in a compressive state between the inner faces of the two mutually disposed jaw-secured bosses 24 and 29. As such, the gripping jaws 22, 23 are normally spring-biased outwardly to a predetermined maximum open position.

While two laterally spaced guide rods and associated coil springs are employed in the illustrative embodiment of the device 10, it is readily apparent that a single centrally located and keyed guide rod, as well as more than two guide rods, could also be employed in a device constructed to function in the manner described herein. Similarly, it should also be appreciated that while the discrete bosses 24 and 29 are shown secured to the respective jaws 21 and 22 by means of illustrative threaded fastening members 35, the respective jaws and associated bosses could also be readily fabricated as integral one-piece structures, if desired.

As best seen in FIGS. 1 and 3-5, the jaws 21 and 22 in the one preferred embodiment have respective inner faces 37 and 38 which are each formed with an array of vertically oriented lead-nesting grooves 37a or 38a. These grooves advantageously insure that the dual-in-line leads 14 of a gripped circuit module 12, when positioned between the jaws 21, 22 of the device 10, as depicted in FIG. 4, will remain in precise alignment, which is of particular importance during a lead-insertion operation.

A longitudinally disposed channel 37b or 38b is also formed in the inner face of each jaw 21 or 22 in the illustrative embodiment, with each channel being positioned to communicate with the upper ends of the associated array of vertically oriented lead-nesting grooves 37a or 38a. The channels 37b, 38b are each dimensioned and located along the inner face of the associated jaw so as to nest a longitudinally disposed edge portion of the circuit module substrate 18. It is understood, of course, that such channels may also be readily dimensioned to receive either respective edge or sidewall portions of many other different types of multi-leaded circuit modules with equal effectivness.

In accordance with an aspect of the present invention, the device 10 also includes a uniquely constructed cover plate 46. The latter is retractably jaw-mounted and keyway-guided to effect the temporary releasable locking of the jaws 21, 22 in a closed position after a circuit module 12 has been gripped therebetween. The cover plate 46 also functions, in cooperation with the coil springs 33, 34, to control the maximum (and optionally minimum) spacing between the jaws.

Considered more specifically, the cover plate 46 is reciprocally mounted primarily on, and mtaintained in slidable contact with, the upper surfaces of the jaw-secured bosses 24 and 29 through the use of two cover plate keyways 48, 49 and three keyway-confined key (or cam) members 51, 53 and 54. As best seen in FIGS. 1 and 4, the key member 51 has an upper headed end, an intermediate shank portion (not seen) that extends through the cover plate keyway 48, and a lower shank end portion (preferably threaded and seen only in phantom in FIG. 4) that is adjustably received within a tapped hole 56 that communicates with the upper surface of the jaw-secured boss 29. The headed key members 53 and 54, which may be identical to key member 51, have intermediate shank portions that extend through the cover plate keyway 49, and lower shank end portions that are threadably received within respectively associated tapped holes 58 (only one seen in FIG. 4) formed in the upper surface of the jaw-secured boss 24.

The cover plate keyway 48, as best seen in FIG. 2, is also formed with a centrally located notch 48a. The depth of this notch is employed to establish the maximum predetermined spacing between the jaws 21 and 22. More specifically, maximum jaw separation occurs when the intermediate shank portion of the key member 51 is spring-biased against the base of the keyway notch 48a, as depicted in FIG. 1.

The minimum spacing between the jaws may be chosen to occur when the intermediate shank portion of the key member 51 abuts against the inner edge portion of the keyway 48 that is directly opposite the notch 48a. Such positioning of the key member 51 (if not prevented by the width dimension of a gripped circuit module) results when manually imparted compressive force is exerted against the jaws 21, 22 sufficient to overcome the normal spring-biased forces exerted thereagainst.

The maximum and minimum cover plate-controlled displacement limits of the jaws 21 and 22 are then seen to be dependent on the maximum width of the keyway 48, as measured between the terminating points of the oppositely directed arrows commonly identified by the reference manual 63 in FIG. 2. In practice, however, it has been found advantageous to provide separate alternative means for adjustably establishing the minimum spacing between the gripping jaws. The reason for this is to further minimize the possibility of excessive manually imparted gripping force being exerted on a given circuit module 12, particularly when codes thereof of different widths are involved, and/or when they are of the type having a relatively fragile body or circuit-supporting substrate, such as of ceramic material.

To that end, a threaded member 66 (best seen in FIG. 2) is mounted on one of the gripping jaws, such as jaw 21, so that the terminating end thereof functions as an adjustable, retractable stop. More specifically, a threaded shank portion of the stop member 66 extends through a central tapped bore 68 formed in an intermediate sidewall area of the jaw 21, and is advanced toward the inner face of the jaw 22 until an initial predetermined restrictive spacing is established therebetween, when the jaws are in an open position. This spacing is chosen to cause the terminating end of the stop 66 to abut the inner face of the jaw 22 immediately after the jaws have been closed sufficiently to reliably grip a given circuit module 12 therebetween. As a result, it is apparent that the initially established position of the terminating end of the stop member 66, when employed, determines the maximum relative displacement that can be imparted between the jaws, provided such displacement is less than that determined by the maximum notch-defined width of the cover plate keyway 48.

In accordance with another aspect of the present invention, the keyway 48 is further defined, in part, by two elongated and tapered edges 48b and c that extend outwardly from opposite sides of the central notch 48a. More specifically, these keyway edges are oriented at oppositely inclined predetermined angles relative to the longitudinal direction of the adjacent jaw 22 so as to effect a wedging action against the key member 51 whenever the cover plate 46 is displaced to the left or right relative to its central position, as depicted in FIG. 1. The directions of possible reciprocal displacement of the cover plate 46 are indicated by the oppositely directed arrows identified by the common reference numeral 71 in FIG. 2, with the particular direction of cover plate displacement illustrated being to the right, as viewed therein.

The maximum displacement of the cover plate 46 in either direction relative to the jaws 21, 22 is determined, of course, by the restricted position of the jaw 22 and, in particular, the key member 51 indirectly secured thereto, at any given item. For example, such a restricted jaw position is normally determined upon both jaws having been moved into a circuit module gripping position, such as depicted in FIG. 4. When so positioned, and upon the cover plate 46 being manually displaced as far as it will go to the right, for example, the key member 51 is then frictionally wedged against the tapered keyway edge 48b so as to effect the releasable locking of the jaws 21, 22 in a circuit module-gripping position.

From the foregoing, it is thus seen that in a typical operating application, whenever the jaws 21, 22 are manually biased toward each other so as to grip a compatible circuit module 12 therebetween, the key member 51 will be released from the keyway notch 48a. This, in turn, allows the cover plate 46 to be manually displaced to either side of the stationary key member 51 until one of the tapered keyway edges 48b or c is firmly biased against that key member. Thereafter, the gripping jaws 21, 22 are advantageously releasably locked in a closed (gripping) position until the cover plate 46 is again manually displaced in the particular longitudinal direction that results in the key member 51 again being urged, under spring bias, into the base of the keyway notch 48a.

As previously mentioned, such releasably locked jaws advantageously allows an operator to more freely use one or both hands to realign any misaligned leads 14 of a gripped circuit module 12, for example, before a lead insertion operation. The jaws when locked also allow an operator to more easily (i.e., with less manual compressive force) hold and manipulate the device, as required, so that the leads of a gripped circuit module may be properly oriented and precisely aligned relative to, and for simultaneous insertion in, an associated multi-lead-receiving member.

While one preferred device embodiment has been disclosed herein for inserting or extracting the leads of multi-leaded circuit modules into or out of aligned lead-receiving through-holes of circuit boards, or receptacles of board-mounted sockets, it is obvious that various modifications may be made to the present illustrative claimed embodiment of the invention, and that a number of alternative related embodiments could be devised by one skilled in the art without departing from the spirit and scope of the invention.

What is claimed is:

1. A device for selectively inserting the dual-in-line leads of a circuit module into and extracting them from respective lead-engaging receptacles of an associated support member, said device comprising:

a pair of mutually disposed gripping jaws;

guide rod means for interconnecting said jaws, said guide rod means including at least one guide rod, with compressively biased spring means associated therewith for normally biasing said jaws apart to a predetermined maximum open position, one end of at least said one guide rod being fixedly secured within a receiving bore of one of said jaws, with the other end of said guide rod being retractably nested within a close-fitting bore formed in the other of said jaws; and cover plate means displaceably confined on the upper surfaces of said jaws, and being for controllably limiting at least the maximum relative linear spring-biased displacement between said jaws, and selectively effecting temporary releasable locking of the jaws after a given circuit module has been gripped therebetween.

2. A device in accordance with claim 1 wherein said guide rod means includes two laterally disposed and parallel extending guide rods, with said spring means comprising a separate coil spring coaxially mounted on each of said guide rods, and wherein each of said gripping jaws includes an upper, inwardly disposed portion within which are formed two guide rod-receiving bores, with each of said jaws further being formed with a relatively thin, elongated and downwardly extending portion having an inner face for gripping a leaded side of a circuit module having downwardly extending dual-in-line leads.

3. A device in accordance with claim 2 further including adjustable stop means for limiting the minimum spacing between said gripping jaws independently of said cover plate means.

4. A device in accordance with claim 1 wherein said cover plate means includes a planar cover plate formed with first and second elongated keyways, each of which extends generally in the longitudinal direction of said jaws, said first keyway accommodating at least two cam members fixedly secured to one jaw and said second keyway accommodating a single cam member fixedly secured to the other of said jaws, with the outer edge of said second keyway also being formed with a centrally located notch that, in part, establishes a maximum cam member-accommodating width that allows said gripping jaws to be displaced toward and away from each other, under spring bias, over a predetermined distance, and wherein said second keyway is additionally tapered along at least one outer edge portion on either side of said notch so as to establish a keyway having a progressively narrower width in the longitudinal direction away from said notch, said tapered keyway portion, in response to the displacement of said cover plate in a predetermined direction relative to the longitudinal direction of said gripping jaws, effecting the temporary releasable locking of said jaws after a circuit module has been gripped therebetween.

5. A device in accordance with claim 2 wherein the inner face of each of said gripping jaws is formed with a plurality of vertically oriented grooves, each of said grooves being for at least partially nesting and reliably maintaining the desired alignment of an associated lead of an array thereof of a circuit module when properly gripped between said jaws.

6. A device in accordance with claim 5 wherein the inner face of each gripping jaw is further formed with a longitudinally disposed channel for at least partially nesting a side portion of a circuit module when gripped between said gripping jaws.

7. A device in accordance with claim 6 wherein said cover plate means includes a planar cover plate formed with first and second elongated keyways, each of which extends generally in the longitudinal direction of said jaws, said first keyway accommodating at least two key members fixedly secured to said inwardly disposed portion of one jaw, and said second keyway accommodating a single key member fixedly secured to said inwardly disposed portion of the other of said jaws, with the outer edge of said second keyway also being formed with a centrally located notch that, in part, establishes a maximum key member-accommodating keyway width that allows said gripping jaws to be displaced toward and away from each other, under spring bias, over a predetermined distance, and wherein said second keyway is additionally formed on opposite sides of said notch with oppositely inclined outer tapered edge portions that progressively decrease the width of said keyway in both directions away from said notch, each of said tapered keyway edge portions, in response to the displacement of said cover plate in a direction toward the other of said edge portions, effecting the temporary releasable locking of said jaws after a given circuit module has been gripped therebetween.

8. A device in accordance with claim 7 further including adjustable stop means for limiting the minimum spacing between said gripping jaws independently of said cover plate means.

9. A device for selectively inserting the dual-in-line leads of a circuit module into and extracting them from respective lead-engaging receptacles of an associated support member, said device comprising:

a pair of mutually disposed gripping jaws;

guide rod means for interconnecting said jaws, said guide rod means including at least two laterally disposed and parallel extending guide rods, with compressively biased spring means associated therewith for normally biasing said jaws apart to a predetermined maximum open position, one common end of each guide rod being fixedly secured within a receiving bore of one of said jaws, with the other common end of each guide rod being retractably nested within a close-fitting bore formed in the other of said jaws, and cover plate means displaceably supported on and keyway-guided along the upper surfaces of said jaws, and being for controllably limiting at least the maximum relative linear spring-biased displacement between said jaws, and selectively effecting temporary releasable locking of the jaws after a given circuit module has been gripped therebetween.

10. A device in accordance with claim 9 wherein said spring means comprises a separate coil spring coaxially mounted on each of said guide rods, and wherein each of said gripping jaws includes an upper, inwardly disposed portion within which are formed two guide rod-receiving bores, with each of said jaws further being formed with a relatively thin, elongated and downwardly extending portion having an inner face for gripping a leaded side of a circuit module having downwardly extending dual-in-line leads.

11. A device in accordance with claim 10 wherein the inner face of each of said gripping jaws is formed with a plurality of vertically oriented grooves, each of said grooves being for at least partially nesting and reliably maintaining the desired alignment of an associated lead of an array thereof of a circuit module when properly gripped between said jaws.

12. A device in accordance with claim 11 wherein the inner face of each gripping jaw is further formed with a longitudinally disposed channel for at least partially nesting side portion of a circuit module when gripped between said gripping jaws.

13. A device in accordance with claim 10 further including adjustable stop means for limiting the minimum spacing between said gripping jaws independently of said cover plate means.

14. A device in accordance with claim 12 wherein said cover plate means includes a planar cover plate formed with first and second elongated keyways, each of which extends generally in the longitudinal direction of said jaws, said first keyway accommodating at least two cam members fixedly secured to said inwardly disposed portion of one jaw, and said second keyway accommodating a single cam member fixedly secured to said inwardly disposed portion of the other of said jaws, with the outer edge of said second keyway also being formed with a centrally located notch that, in part, establishes a maximum cam member-accommodating keyway width that allows said gripping jaws to be displaced toward and away from each other, under spring bias, over a predetermined distance, and wherein said second keyway is additionally formed on opposite sides of said notch with oppositely inclined outer tapered edge portions that progressively decrease the width of said keyway in both directions away from said notch, each of said tapered keyway edge portions, in response to the displacement of said cover plate in a direction toward the other of said edge portions, effecting the temporary releasable locking of said jaws after a given circuit module has been gripped therebetween.

15. A device in accordance with claim 14 further including adjustable stop means for limiting the minumum spacing between said gripping jaws independently of said cover plate means.

* * * * *